United States Patent
Chi

(10) Patent No.: US 11,420,294 B2
(45) Date of Patent: Aug. 23, 2022

(54) WAFER PROCESSING METHOD

(71) Applicant: DISCO CORPORATION, Tokyo (JP)

(72) Inventor: Jingshi Chi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 940 days.

(21) Appl. No.: 16/200,942

(22) Filed: Nov. 27, 2018

(65) Prior Publication Data

US 2019/0160597 A1 May 30, 2019

(30) Foreign Application Priority Data

Nov. 30, 2017 (JP) .............................. JP2017-230050

(51) Int. Cl.
| | |
|---|---|
| *B23K 26/53* | (2014.01) |
| *B81C 1/00* | (2006.01) |
| *B23K 26/00* | (2014.01) |
| *B23K 26/0622* | (2014.01) |
| *C03B 33/02* | (2006.01) |
| *B23K 26/08* | (2014.01) |
| *B28D 5/00* | (2006.01) |

(Continued)

(52) U.S. Cl.
CPC .......... *B23K 26/53* (2015.10); *B23K 26/0006* (2013.01); *B23K 26/0622* (2015.10); *B23K 26/0648* (2013.01); *B23K 26/08* (2013.01); *B28D 5/0011* (2013.01); *B28D 5/0023* (2013.01); *B28D 5/0052* (2013.01); *B81C 1/00904* (2013.01); *C03B 33/0222* (2013.01); *B23K 2103/54* (2018.08); *G02F 1/133331* (2021.01)

(58) Field of Classification Search
CPC ................ B23K 26/53; B23K 26/0622; B23K 26/0006; B23K 26/0648; B23K 26/08; B23K 2103/54; B28D 5/0023; B28D 5/0052; B81C 1/00904; C03B 33/0222

USPC ......................................................... 438/436
See application file for complete search history.

(56) References Cited

U.S. PATENT DOCUMENTS

| | | | | |
|---|---|---|---|---|
| 2007/0066044 A1* | 3/2007 | Abe | ..................... | H01L 21/6835 438/612 |
| 2013/0050227 A1* | 2/2013 | Petersen | .................. | B81B 7/007 345/501 |
| 2015/0343559 A1* | 12/2015 | Morikazu | .............. | C03B 33/082 65/112 |

FOREIGN PATENT DOCUMENTS

| | | | | |
|---|---|---|---|---|
| CN | 1516635 A | * | 7/2004 | ......... B23K 26/0869 |
| JP | 10305420 A | | 11/1998 | |

(Continued)

*Primary Examiner* — Tu B Hoang
*Assistant Examiner* — Aaron G Wright
(74) *Attorney, Agent, or Firm* — Greer Burns & Crain Ltd.

(57) ABSTRACT

A wafer processing method is disclosed to divide a wafer of glass substrate into individual chips along division lines. In the shield tunnel forming step, a pulsed laser beam of a wavelength, which transmits through the wafer, is irradiated with its focal point positioned at a region corresponding to each division line so that a plurality of shield tunnels which are each formed of perforations and affected regions surrounding the perforations are formed along the division lines, respectively. In the modified layer forming step, another pulsed laser beam of a wavelength, which transmits through the wafer, is irradiated with its focal point positioned at the region corresponding to each division line so that modified layers are formed in addition to the shield tunnels along the division lines, respectively. In the dividing step, an external force is applied to the wafer to divide the wafer into individual chips.

7 Claims, 2 Drawing Sheets

(51) Int. Cl.
*B23K 26/06* (2014.01)
*B23K 103/00* (2006.01)
*G02F 1/1333* (2006.01)

(56) References Cited

FOREIGN PATENT DOCUMENTS

| | | | |
|---|---|---|---|
| JP | 2002192370 A | 7/2002 | |
| JP | 2014221483 A | 11/2014 | |

* cited by examiner

WAFER PROCESSING METHOD

BACKGROUND OF THE INVENTION

Field of the Invention

The present invention relates to a wafer processing method for dividing a wafer of glass substrate into individual chips.

Description of the Related Art

A wafer of glass substrate, which carries on its surface devices, for example, medical sensors such as micro electro mechanical systems (MEMSs)(hereinafter called "medical sensors") formed in individual regions divided by a plurality of intersecting division lines, is divided into individual chips by a processing apparatus, and the divided device chips are used in medical instruments, testing instruments and the like.

If the wafer is divided into individual chips by a dicing apparatus on which cutting blades are rotatably arranged, minute chipping occurs in cutting regions so that the resulting chips fail to meet an acceptable quality level. Upon dividing the wafer, a laser processing apparatus is therefore used to perform the division by irradiating a laser beam.

Laser processing apparatus are known to include the following three types:

(1) A laser beam of a wavelength that is absorbed in a wafer is irradiated to the wafer with its focal point positioned on a surface of each division line to form dividing grooves by so-called ablation processing, and the wafer is then divided into individual chips (see, for example, Japanese Patent Laid-open No. Hei 10-305420).

(2) A laser beam of a wavelength that transmits through a wafer is irradiated to the wafer with its focal point positioned, corresponding to each division line, inside the wafer to continuously form modified layers as division starting points inside the wafer, and the wafer is then divided into individual chips (see, for example, Japanese Patent No. 3408805).

(3) Using a condenser lens that the value obtained by dividing the numerical aperture (NA) of the condenser lens with the refractive index (n) of a workpiece (wafer) upon irradiation of a laser beam falls within a range of 0.05 to 0.2, a laser beam of a wavelength that transmits through the workpiece is irradiated to the workpiece with a focal point positioned, corresponding to each division line, inside the workpiece to continuously form a plurality of shield tunnels, each of which is formed of perforations and amorphous regions surrounding the perforations, along each division line, and the wafer is then divided into individual chips (see, for example, Japanese Patent Laid-open No. 2014-221483).

SUMMARY OF THE INVENTION

If a wafer of glass substrate is divided by a laser processing apparatus of the type that applies the above-described ablation processing, however, a problem arises in that debris scatters around from the surfaces of the wafer and sticks to devices to lower their quality.

According to a processing method of the type that by a laser processing apparatus which continuously forms modified layers as division starting points inside a wafer, the modified layers are formed and an external force is then applied to the wafer to divide the wafer into individual chips, the wafer can be divided straight along division lines. If a workpiece is a wafer of amorphous glass substrate, however, a problem arises in that due to the amorphousness of the glass substrate, dividing planes extend meandering from the front surface to the back surface and vertical side walls are hardly formed.

According to a processing method of the type that a plurality of shield tunnels is formed inside a wafer along division lines by a laser processing machine and an external force is applied to the wafer to divide it into individual chips, on the other hand, the wafer can be vertically divided. Because of the existence of predetermined spacings between the adjacent shield tunnels, a problem arises in that the division can be hardly performed if the size of each chip as seen in plan view is small relative to its thickness.

It is therefore an object of the present invention to provide a wafer processing method that can divide a wafer of glass substrate into individual chips without lowering the quality of devices.

In accordance with an aspect of the present invention, there is provided a wafer processing method for dividing a wafer of glass substrate into individual chips along a plurality of division lines formed intersecting one another. The wafer processing method includes a shield tunnel forming step of irradiating a first pulsed laser beam of a wavelength, which transmits through the wafer, with its focal point positioned inside the wafer at a region corresponding to each division line so that a plurality of shield tunnels which are each formed of perforations and affected regions surrounding the perforations are formed along the division lines, respectively, a modified layer forming step of irradiating a second pulsed laser beam of a wavelength, which transmits through the wafer, with its focal point positioned inside the wafer at the region corresponding to each division line so that modified layers are formed in addition to the shield tunnels along the division lines, respectively, and a dividing step of applying an external force to the wafer to divide the wafer into individual chips.

Preferably, the wafer may have a thickness of at least a half of a length of a side of each chip as seen in plan view. Also preferably, each chip may carry a medical sensor on a surface thereof.

According to the present invention, upon dividing a wafer into individual chips, each divided chip has vertical side walls extending from its front surface to its back surface without meandering along the side walls thereof. Therefore, a wafer can be divided well even if it is desired to obtain chips having a small size relative to the thickness of the wafer.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
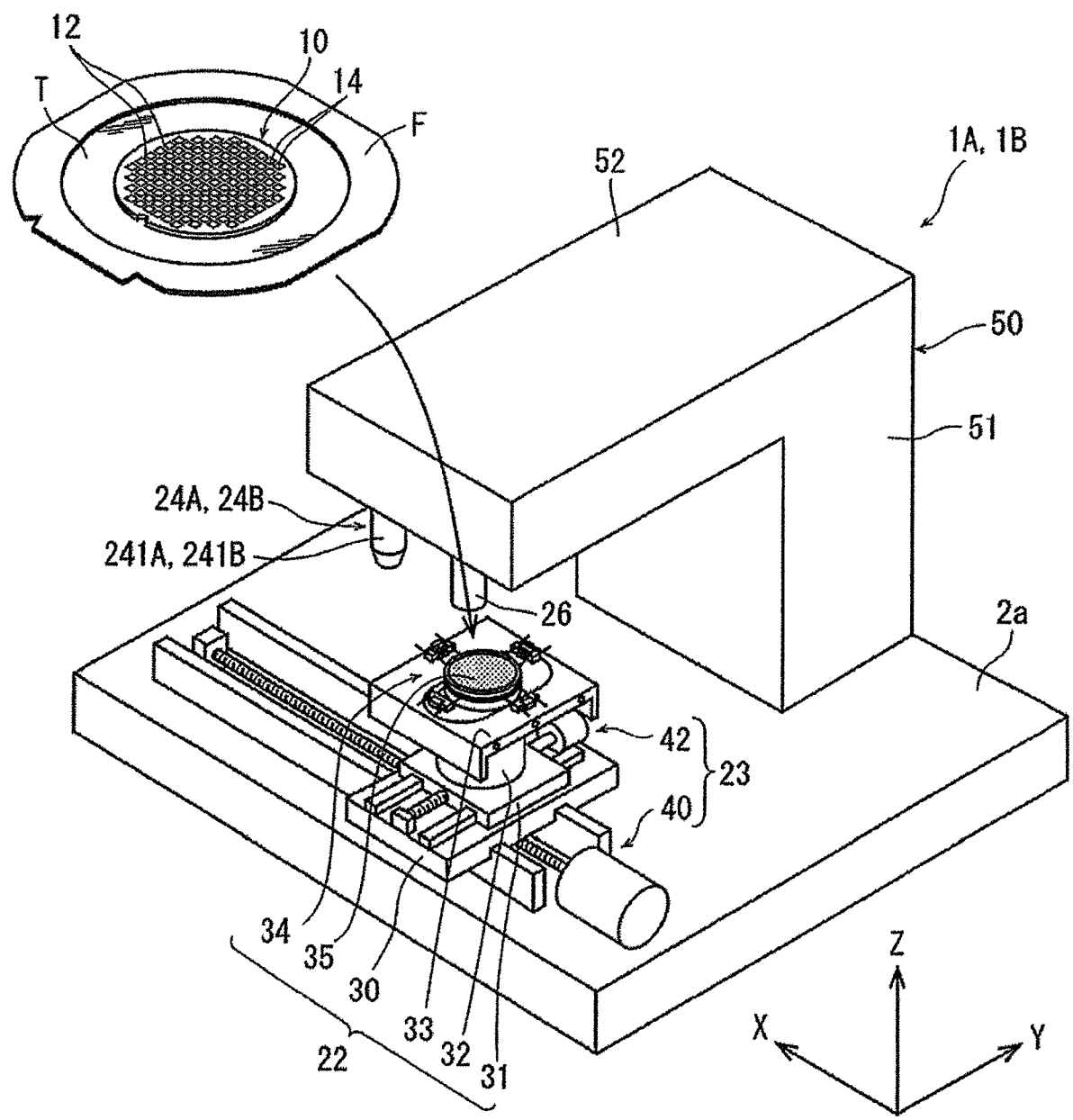
FIG. 1 is an overall perspective view of a laser processing apparatus for performing a wafer processing method according to an embodiment of the present invention.

With reference to the accompanying drawings, a description will hereinafter be made in further detail about a laser processing method according to an embodiment of the present invention and a laser processing apparatus for practicing the laser processing method. FIG. 1 is an overall perspective view of a laser processing apparatus 1A and another laser processing apparatus 1B, which are configured to perform a shield tunnel forming step and a modified layer forming step, respectively, in the laser processing method according to the embodiment of the present invention. It is to be noted that, as the laser processing apparatus 1A and the laser processing apparatus 1B have the same external shape, the laser processing apparatus 1A and laser processing apparatus 1B are depicted as a single laser processing apparatus in the overall perspective view by writing different numerals together to designate each element different in internal configuration.

A description will now be made about the laser processing apparatus 1A for forming shield tunnels. The laser processing apparatus 1A includes a holding unit 22, a moving mechanism 23, a laser beam irradiation unit 24A, and a frame 50. The holding unit 22 holds a wafer 10 as a workpiece in this embodiment. The moving mechanism 23 is disposed on a fixed base 2a and moves the holding unit 22. The laser beam irradiation unit 24A irradiates a laser beam to the wafer 10 held on the holding unit 22. The frame 50 has a vertical wall portion 51 disposed on the fixed base 2a and on a side of the moving mechanism 23 and extending upright in a Z direction indicated by arrow Z, and a horizontal wall portion 52 extending in a horizontal direction from an upper end portion of the vertical wall portion 51.

An optical system of the laser beam irradiation unit 24A that makes up a main part of the laser processing apparatus 1A is built in the horizontal wall portion 52 of the frame 50, and a condenser 241A that is a component of the laser beam irradiation unit 24A is disposed on the side of a lower surface of a free end portion of the horizontal wall portion 52. Further, an image capture unit 26 is disposed at a position adjacent the condenser 241A in an X direction indicated by arrow X in the figure. The holding unit 22 holds the wafer 10 which is in turn held on an annular frame F via an adhesive tape T as depicted on an enlarged scale in an upper left corner of the figure. In this embodiment, a glass substrate that makes up the wafer 10 is made from an amorphous glass material formed of a silicate compound (silicate mineral).

The holding unit 22 includes a rectangular X movable plate 30, a rectangular Y movable plate 31, a cylindrical post 32, and a rectangular cover plate 33. The X movable plate 30 is mounted on the base 2a movably in the X direction indicated by arrow X in the figure, and the Y movable plate 31 is mounted on the X movable plate 30 movably in a Y direction indicated by arrow Y in the figure. The post 32 is fixed on an upper surface of the Y movable plate 31, and the cover plate 33 is fixed on an upper end of the post 32. Disposed on the cover plate 33 is a chuck table 34, which extends upward through a slot formed in the cover plate 33 and is configured to hold the circular workpiece and to be rotatable by an undepicted rotary drive. Arranged on an upper surface of the chuck table 34 is a circular suction chuck 35, which is formed from a porous material and extends substantially horizontally. The suction chuck 35 is connected to an undepicted suction means via a flow passage that extends through the post 32. The X direction is a direction indicated by arrow X in FIG. 1, and the Y direction is a direction that is indicated by arrow Y in FIG. 1 and intersects the X direction at right angles. A plane defined by the X direction and the Y direction is substantially horizontal.

The moving mechanism 23 includes an X moving mechanism 40 and a Y moving mechanism 42. Via a ball screw, the X moving mechanism 40 converts the rotational motion of a motor into linear motion and transmits the linear motion to the X movable plate 30, whereby the X movable plate 30 is advanced or retracted in the X direction along guide rails on the base 2a. Via a ball screw, the Y moving mechanism 42 converts the rotational motion of a motor into linear motion and transmits the linear motion to the Y movable plate 31, whereby the Y movable plate 31 is advanced or retracted in the Y direction along guide rails on the X movable plate 30. Although depiction is omitted in the figure, the X moving mechanism 40 and Y moving mechanism 42 each include a position detection means, so that the positions of the chuck table 34 in the X and Y directions and the angular position of the chuck table 34 in the circumferential direction are accurately detected. Based on signals instructed from an undepicted control unit, the X moving mechanism 40 and Y moving mechanism 42 and the undepicted rotary drive means are driven so that the chuck table 34 can be accurately positioned at a desired position and angle.

As depicted in the upper left corner of FIG. 1, the wafer 10 as the workpiece carries devices 14 formed in regions divided by division lines 12, and is held on the chuck table 34 in a state that it is supported on the annular frame F via the adhesive tape T. The above-described X moving mechanism 40 and Y moving mechanism 42 are then operated while operating the laser beam irradiation unit 24A to irradiate a pulsed laser beam from the condenser 241A to the wafer 10, whereby laser processing is performed along the division lines 12 to form shield tunnels. The devices 14 in this embodiment are medical sensors, for example, medical MEMS sensors with medical acceleration sensors mounted thereon.

Figure 2:
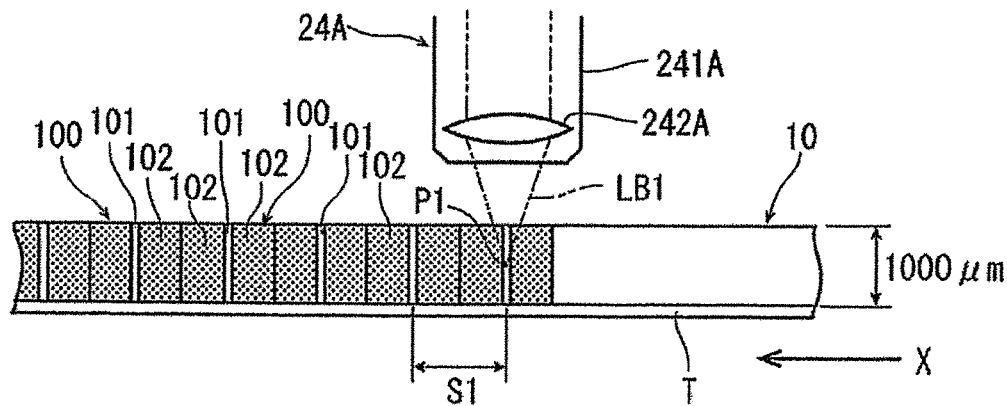
FIG. 2 is an enlarged cross-sectional view of essential parts upon performing a shield tunnel forming step by the laser processing apparatus depicted in FIG. 1.

The laser beam irradiation unit 24A is set as desired according to the material and thickness of the glass substrate forming the wafer 10 and the shape of chips to be obtained after the division, and may include, for example, a laser oscillator, which emits a laser beam of 1030 nm wavelength, and an attenuator or the like for adjusting the output (both not depicted). A condenser lens 242A (see FIG. 2), which is included in the condenser 241A, has a numerical aperture (NA) set at 0.25. As a consequence, a value of 0.17 is obtained by dividing the numerical aperture with the refractive index of 1.5 of the glass substrate that makes up the wafer 10. By setting the numerical aperture of a condenser lens, which is to be used for the formation of shield tunnels, so that the value obtained by dividing the numerical aperture of the condenser lens with the refractive index of the glass substrate falls within a range of 0.05 to 0.2, the shield tunnels can be formed with good quality.

FIG. 1 also depicts an overall perspective view of the laser processing apparatus 1B configured to perform the modified layer forming step in the laser processing method according to this embodiment. Compared with the laser processing apparatus 1A described above, the laser processing apparatus 1B is different only in a laser beam irradiation unit 24B and a condenser 241B that constitutes a component of the laser beam irradiation unit 24B, so that only these different elements are also designated by the different numerals and the remaining elements are designated by the same numerals as in the laser processing apparatus 1A.

Figure 3:
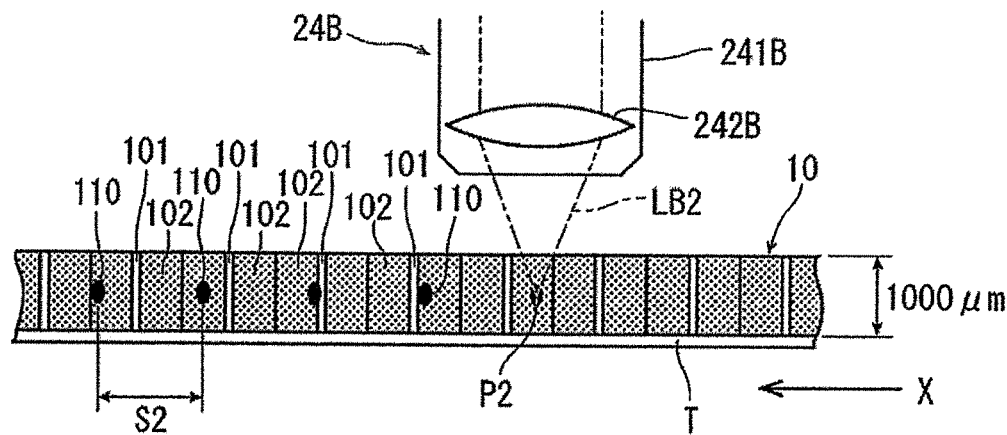
FIG. 3 is an enlarged cross-sectional view of essential parts upon performing a modified layer forming step by the laser processing apparatus depicted in FIG. 1.

The laser beam irradiation unit 24B that realizes the modified layer forming step is set as desired according to the material and thickness of the glass substrate forming the wafer 10 and the shape of the chips to be obtained after the division, and may include, for example, a laser oscillator which emits a laser beam of 532 nm wavelength, and an attenuator or the like for adjusting the output (both not depicted). A condenser lens 242B (see FIG. 3), which is included in the condenser 241B of the laser beam irradiation unit 24B, has a numerical aperture set, for example, at 0.8.

The laser processing apparatuses 1A and 1B in this embodiment are generally configured as described above. A description will hereinafter be made about the operation of the laser processing method to be performed by the laser processing apparatuses 1A and 1B.

First Example

A description will first be made about a first example. A wafer 10 to be used as a workpiece in the first example has a thickness of 1000 μm (1 mm) and a chip size of 2 mm×2 mm as seen in plan view. Upon performing laser processing, the unprocessed wafer 10 held on a circular frame F via an adhesive tape T is provided, and a holding step is performed to hold the wafer 10 on the chuck table 34 of the laser processing apparatus 1A. Described more specifically, the wafer 10 is mounted on the chuck table 34 of the laser processing apparatus 1A depicted in FIG. 1 with the side of the adhesive tape T facing downward, the undepicted suction means is operated to hold the wafer 10 under suction via the suction chuck 35, and the frame F is then fixed by clamps or the like with the wafer 10 exposed upward.

After the wafer 10 has been held under suction on the suction chuck 35, the X moving mechanism 40 and Y moving mechanism 42 are operated, whereby the chuck table 34 is moved to position the wafer 10 right underneath the image capture unit 26. After the chuck table 34 has been positioned right underneath the image capture unit 26, an alignment step is performed by the image capture unit 26 and an undepicted control unit to detect regions of the wafer 10, which are to be subjected to laser processing. Described specifically, the image capture unit 26 and the undepicted control unit conduct alignment of laser beam irradiation points by performing image processing such as pattern matching to conduct alignment between each division line 12 formed in a first direction on the wafer 10 and the condenser 241A of the laser beam irradiation unit 24A that irradiates a laser beam along the division line 12. A similar alignment step is also performed along each division line 12 formed in a second direction that intersects the first direction at right angles.

After completion of the above-described alignment step, the chuck table 34 is moved to a laser beam irradiation region where the condenser 241A is located, so that one of the outermost division lines of the division lines 12 formed in the first direction comes at an end thereof right underneath the condenser 241A. An undepicted focal point adjustment means is then operated to adjust the position of the condenser 241A in the direction of its optical axis (Z direction) so that a focal point P1 is positioned at a predetermined point inside the wafer 10 as understood from FIG. 2 that depicts the schematic cross-sectional view at the time of laser processing in the shield tunnel forming step.

After the focal point P1 has been positioned as described above, the laser beam irradiation unit 24A is operated so that a pulsed laser beam is oscillated by an undepicted laser oscillator for the formation of shield tunnels inside the wafer 10. The pulsed laser beam LB1 emitted from the undepicted laser oscillator is adjusted in output to a predetermined value by the undepicted attenuator, is condensed by the condenser lens 242A of the condenser 241A, and is irradiated to one end of one of the outermost division lines 12 of the division lines 12 of the wafer 10. After the irradiation of the laser beam LB1 has been started, the X moving mechanism 40 is operated to move the chuck table 34 in the X direction indicated by arrow X in FIG. 2 so that the laser beam LB1 is irradiated along the division line 12. By repeating the above-described shield tunnel forming operation with respect to each of the remaining division lines 12, shield tunnels 100, each of which is formed of perforations 101 extending in an up-to-down direction and affected regions 102 surrounding the perforations 101 and affected and weakened, are continuously formed along the division lines 12, respectively.

By operating the laser beam irradiation unit 24A, chuck table 34, X moving mechanism 40 and Y moving mechanism 42, shield tunnels 100 are continuously formed along all the division lines 12 formed in a lattice pattern on a surface of the wafer 10. In this manner, the shield tunnel forming step is completed. In this example, the processing conditions are set so that the perforation 101 of each shield tunnel 100 has a diameter of 1 μm and the affected region 102 surrounding each perforation 101 has a diameter of 10 μm. As each perforation 101 is formed along a centerline of its corresponding affected region 102, a spacing S1 between the perforations 101 of each two adjacent shield tunnels 100 is 10 μm.

The laser processing conditions in the above-described shield tunnel forming step may be set, for example, as will be described next. It is to be noted that a defocus of −500 μm means that a focal point is positioned 500 μm below from the surface of the wafer 10.

Wavelength: 1030 nm
Average output: 0.5 W
Repeat frequency: 10 kHz
Numerical aperture of condenser lens: 0.25
Defocus −500 μm
Processing feed speed in X direction: 100 mm/sec After the above-described shield tunnel forming step has been performed, the modified layer forming step is performed. Described more specifically, a suction means connected to the chuck table 34 of the laser processing apparatus 1A is stopped, and the wafer 10 with the shield tunnels 100 formed along the division lines 12 is taken out together with the frame F, is conveyed to the laser processing apparatus 1B that performs the modified layer forming step, and is mounted and held under suction on a suction chuck 35 of a chuck table 34 of the laser processing apparatus 1B.

After the wafer 10 held on the frame F has been held under suction on the suction chuck 35 of the laser processing apparatus 1B, the alignment step performed in the shield tunnel forming step is performed again. After alignment has been conducted between the condenser 24B and each division line 12 of the wafer 10 in the alignment step, the chuck table 34 is moved to the laser beam irradiation region where the condenser 241B is located, so that one of the outermost division lines of the division lines 12 formed in the first direction comes at an end thereof right underneath the condenser 241B. The undepicted focal point adjustment means is then operated to move the condenser 241B in the direction of its optical axis (Z direction) so that a focal point P2 is positioned at a predetermined point inside the glass substrate forming the wafer 10 as understood from FIG. 3 that depicts the schematic cross-sectional view of a state of processing in the modified layer forming step.

After the focal point P2 has been positioned as described above, the laser beam irradiation unit 24B is operated so that a pulsed laser beam is oscillated by the undepicted laser oscillator for the formation of modified layers 110 inside the wafer 10. A pulsed laser beam LB2 emitted from the undepicted laser oscillator is adjusted in output to a predetermined value by the undepicted attenuator, is condensed by the condenser lens 242B arrange in the condenser 241B, and is irradiated to one end of one of the two outermost division lines of the division lines 12 of the wafer 10. After the irradiation of the laser beam LB2 has been started, the X moving mechanism 40 is operated to move the chuck table 34 in the X direction indicated by arrow X in FIG. 3 so that the laser beam LB2 is irradiated along the division line 12 along which the shield tunnel 100 have already been formed. By repeating the above-described modified layer forming operation with respect to each of the remaining division lines 12, modified layers 110 are continuously formed along the division lines 12, respectively.

By operating the laser beam irradiation unit 24B, chuck table 34, X moving mechanism 40 and Y moving mechanism 42, modified layers 110 are formed along all the division lines 12 formed in the lattice pattern on the surface of the wafer 10. In this manner, the modified layer forming step is completed.

The processing conditions in the above-described modification layer forming step may be set, for example, as the followings:

Wavelength: 532 nm
Average output: 0.25 W
Repeat frequency: 15 kHz
Numerical aperture of condenser lens: 0.8
Defocus: −500 μm
Processing feed speed in X direction: 210 mm/second Under the above-described processing conditions for the modified layer forming step, the irradiation spacing S2 of the pulsed laser beam LB2 upon formation of the modified layers 110 is set at 14 μm. As a consequence, the modified layers 110 are formed at the spacing S2 different from the spacing S1 of 10 μm between the adjacent shield tunnels 100 so that weakening of the wafer 10 is appropriately achieved along the division lines 12.

Figure 4:
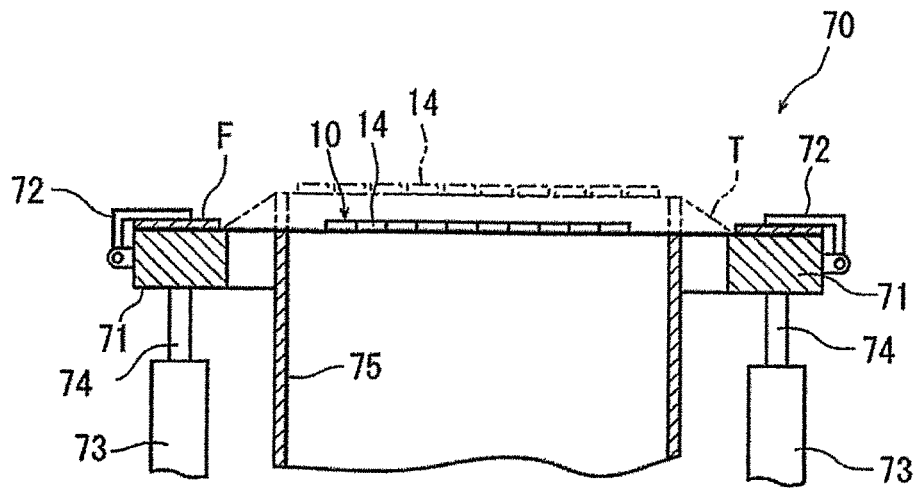
FIG. 4 is a cross-sectional view depicting a state that a dividing step is performed on a wafer under an external force applied by a wafer expander.

After the modified layer forming step has been performed as described above, the wafer 10 is taken out of the laser processing apparatus 1B, and is then subjected to a diving step that applies an external force to divide the wafer 10 into individual chips. About a wafer expander 70 configured to perform the dividing step in this embodiment, a description will be made with reference to FIG. 4.

The depicted wafer expander 70 includes a frame holding member 71 that holds the annular frame F which in turn holds the wafer 10, clamps 72 disposed as fixing means on an outer periphery of the frame holding member 71, and an expansion drum 75 disposed on an inner side of the frame holding member 71. The expansion drum 75 has an outer diameter smaller than the inner diameter of the annular frame F and an inner diameter greater than the outer diameter of the wafer 10 bonded on the adhesive tape T attached to the annular frame F. Further, the expansion drum 75 includes, on a lower end portion thereof, an undepicted support flange formed extending outward in a dial direction, and air cylinders 73 are disposed on the support flange to advance or retract the frame holding member 71 in the up-to-down direction. Piston rods 74 which are advanced or retracted in the up-to-down direction by the air cylinders 73 are connected to a lower surface of the frame holding member 71. A support means, which is composed of the air cylinders 73 and piston rods 74 as described above, is configured to selectively move the annular frame holding member 71 to a normal position, which is at substantially the same height as an upper end of the expansion drum 75 as indicated by solid lines in FIG. 4, or to an expanded position which is above from the upper end of the expansion drum 75 by a predetermined distance as indicated by phantom lines in FIG. 4.

A description will now be made about operation and functions of the above-described wafer expander 70. The wafer 10 with the shield tunnels 100 and modified layers 110 formed along the division lines 12 is mounted on a mount surface of the frame holding member 71 together with the annular frame F on which the wafer 10 is supported via the adhesive tape T, and is fixed on the frame holding member 71 by the clamps 72. At this time, the frame holding member 71 is positioned at the normal position indicated by solid lines in FIG. 4.

After the annular frame F with the wafer 10 supported thereon has been fixed on the frame holding member 71 positioned at the normal position indicated by solid lines in the figure, the air cylinders 73 that make up a tape expansion means are operated to lower the annular frame holding member 71. Consequently, the annular frame F fixed on the mount surface of the frame holding member 71 is also lowered, so that as indicated by phantom lines in the figure, the adhesive tape T attached to the annular frame F comes into contact with an upper end edge of the expansion drum 75, which is rising relative to the annular frame F, and is expanded accordingly. As a result, a tensile force radially acts on the wafer 10 bonded to the adhesive tape T, and the division lines 12, along which the wafer 10 has been weakened by the shield tunnels 100 and modified layers 110, serve as division starting points to divide the wafer 10 into individual chips. Through the operation described above, the dividing step is completed.

After the dividing step has been completed as described above, a pickup means is used as needed, and the individually divided devices 14 are picked up and are stored in a container or are conveyed to a next step as desired.

The present invention is not limited to the above-described first example, and according to the thickness of the wafer 10 and the size of chips to be fabricated, the laser processing conditions for each of the shield tunnel forming step and modified layer forming step can also be set as in a second example and a third example to be described below. It is to be noted that a description will be omitted about details of operation other than laser processing conditions because the laser processing conditions are the same as in the above-described wafer processing method in the first embodiment.

Second Example

Wafer structure: Thickness 500 μm
Chip size: 1 mm×1 mm
Use: Medical sensors
<Shield Tunnel Forming Step>
Wavelength: 1030 nm
Average output: 0.45 W
Repeat frequency: 10 kHz
Numerical aperture of condenser lens: 0.25
Defocus: −240 μm
Processing feed speed in X direction: 100 mm/sec <Modified Layer Forming Step>
  Wavelength: 532 nm
  Average output: 0.21 W
  Repeat frequency: 15 kHz
  Numerical aperture of condenser lens: 0.8
  Defocus: 240 µm
  Processing feed speed in X direction: 210 mm/sec Third Example Wafer structure Thickness: 300 µm
  Chip size: 0.5 mm×0.5 mm
  Use: Medical sensors
<Shield Tunnel Forming Step>
  Wavelength: 1030 nm
  Average output: 0.35 W
  Repeat frequency: 10 kHz
  Numerical aperture of condenser lens: 0.25
  Defocus: −150 µm
  Processing feed speed in X direction: 100 mm/sec
<Modified Layer Forming Step>
  Wavelength: 532 nm
  Average output: 0.21 W
  Repeat frequency: 15 kHz
  Numerical aperture of condenser lens: 0.8
  Defocus: −160 µm
  Processing feed speed in X direction: 210 mm/sec As has been described above, the wafer divided in each example described above has a thickness of at least a half of the length of a side of each chip as seen in plan view. Even if it is desired to divide a thick wafer into chips of small size as in the examples, the use of the above-described wafer processing method can form vertical side walls from the front surface to the rear surface of the divided chips without meandering along the side walls of the chips. Especially in the technical field of medical sensors, situations are envisaged where a wafer has a large thickness dimension ratio relative to a chip size. Even in such situations, chips of good quality can be obtained by the above-described wafer processing method.

In each example described above, the modified layer forming step that forms the modified layer 110 is performed after performing the shield tunnel forming step to form the shield tunnels 100 in the wafer 10. However, the order of performance of the shield tunnel forming step and the modified layer forming step is not limited to the above-described order, and the shield tunnel forming step may be performed after performing the modified layer forming step. Preferably, however, the shield tunnel forming step may be performed first because the formation of the shield tunnels 100 is not inhibited by the modified layers 110 if the modified layer forming step is performed after performing the shield tunnel forming step.

In each example described above, upon setting the spacing S1 between the adjacent shield tunnels 100 and the spacing S2 between the adjacent modified layers 110, the spacing S2 is set at a value greater than the spacing S1. However, the dimensional relationship between the spacing S1 and the spacing S2 is not limited to the above-described dimensional relationship, and the spacing S2 may be set at a smaller value than the spacing S1 to densely form the modified layers 110.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer of glass substrate into individual chips along a plurality of division lines formed intersecting one another, comprising:
    a first step of forming a plurality of shield tunnels by irradiating the water with a first pulsed laser beam of a first wavelength, which transmits through the wafer, with its focal point positioned inside the wafer at a region corresponding to each division line so that the plurality of shield tunnels, which are each formed of perforations and affected regions surrounding the perforations, are formed along the division lines, respectively,
    a second step of forming a plurality of modified layers, subsequent to the first step of forming the shield tunnels, by irradiating the wafer with a second pulsed laser beam of a second wavelength, which transmits through the wafer, with its focal point positioned inside the wafer at the region corresponding to each division line so that modified layers are formed in addition to the shield tunnels along the division lines, respectively, and
    a dividing step of applying an external force to the wafer to divide the wafer into individual chips.

2. The wafer processing method according to claim 1, wherein the wafer has a thickness of at least a half of a length of a surface of each chip as seen in plan view.

3. The wafer processing method according to claim 1, wherein each of the chips is a medical sensor.

4. The wafer processing method according to claim 1, wherein the first wavelength of the first pulsed laser beam is longer than the second wavelength of the second pulsed laser beam.

5. The wafer processing method according to claim 1, wherein the shield tunnels are formed having a first spacing and the second modified layers are formed having a second spacing different from the first spacing.

6. The wafer processing method according to claim 5, wherein the second spacing of the modified layers is wider than the first spacing of the shield tunnels.

7. The wafer processing method according to claim 1, wherein the shield tunnels and the modified layers are formed alternately with respect to each other along the division lines.

* * * * *